United States Patent
Koo et al.

(10) Patent No.: US 12,261,219 B2
(45) Date of Patent: Mar. 25, 2025

(54) SEMICONDUCTOR DEVICE INCLUDING FERROELECTRIC LAYER AND INSULATION LAYER WITH METAL PARTICLES AND METHODS OF MANUFACTURING THE SAME

(71) Applicant: SK hynix Inc., Icheon-si (KR)

(72) Inventors: Won Tae Koo, Icheon-si (KR); Jae Gil Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 174 days.

(21) Appl. No.: 17/674,835

(22) Filed: Feb. 17, 2022

(65) Prior Publication Data

US 2023/0099330 A1 Mar. 30, 2023

(30) Foreign Application Priority Data

Sep. 24, 2021 (KR) ........................ 10-2021-0126756

(51) Int. Cl.
| | | |
|---|---|---|
| H01L 29/51 | (2006.01) | |
| H01L 21/28 | (2006.01) | |
| H01L 29/423 | (2006.01) | |
| H01L 29/66 | (2006.01) | |
| H01L 29/78 | (2006.01) | |

(52) U.S. Cl.
CPC .. *H01L 29/78391* (2014.09); *H01L 29/40111* (2019.08); *H01L 29/42348* (2013.01); *H01L 29/516* (2013.01); *H01L 29/6684* (2013.01)

(58) Field of Classification Search
CPC ......... H01L 29/78391; H01L 29/40111; H01L 29/42348; H01L 29/516; H01L 29/6684; H01L 29/40114; H01L 29/42324; H10B 41/27; H10B 51/20

USPC ........................................................ 257/295
See application file for complete search history.

(56) References Cited

U.S. PATENT DOCUMENTS

| | | | |
|---|---|---|---|
| 5,724,112 A * | 3/1998 | Yoshida | G02F 1/133553 349/114 |
| 6,396,095 B1 * | 5/2002 | Shimada | H01L 29/40111 257/295 |
| 6,828,582 B1 * | 12/2004 | Ando | H10K 10/466 257/350 |
| 10,141,414 B1 * | 11/2018 | Galatage | H01L 29/788 |
| 2006/0102967 A1 * | 5/2006 | Kamigaki | H10B 41/30 257/209 |
| 2006/0208624 A1 * | 9/2006 | Yoshimoto | H01L 27/1292 345/87 |
| 2007/0190721 A1 * | 8/2007 | Cha | H01L 29/792 438/257 |
| 2007/0235812 A1 * | 10/2007 | Fujiwara | G11C 16/0408 257/E21.21 |
| 2007/0252130 A1 * | 11/2007 | Yang | H10K 10/40 977/932 |
| 2008/0171411 A1 * | 7/2008 | Takata | H01L 29/42332 257/E29.302 |
| 2009/0218605 A1 * | 9/2009 | Jain | H01L 29/1054 257/E21.409 |
| 2009/0321727 A1 * | 12/2009 | Yutani | H10K 19/10 257/E21.411 |

(Continued)

*Primary Examiner* — Sheikh Maruf

(57) ABSTRACT

A semiconductor device includes a substrate, a ferroelectric layer disposed on the substrate, a gate insulation layer disposed on the ferroelectric layer, metal particles disposed in the gate insulation layer, and a gate electrode layer disposed on the gate insulation layer.

22 Claims, 19 Drawing Sheets

(56) References Cited

U.S. PATENT DOCUMENTS

| | | | |
|---|---|---|---|
| 2010/0025660 A1* | 2/2010 | Jain | B82Y 10/00 |
| | | | 257/253 |
| 2010/0044775 A1* | 2/2010 | Sunamura | H01L 29/7923 |
| | | | 257/314 |
| 2012/0056161 A1* | 3/2012 | Avouris | H01L 29/42384 |
| | | | 257/E29.241 |
| 2013/0056729 A1* | 3/2013 | Misaki | H01L 27/1225 |
| | | | 257/43 |
| 2014/0231897 A1* | 8/2014 | Terai | H01L 29/792 |
| | | | 257/324 |
| 2014/0369126 A1* | 12/2014 | Lee | H01L 29/42324 |
| | | | 257/314 |
| 2015/0311458 A1* | 10/2015 | Jin | H10K 10/488 |
| | | | 257/347 |
| 2016/0190329 A1* | 6/2016 | Matsumoto | G09G 3/2092 |
| | | | 345/55 |
| 2016/0308070 A1* | 10/2016 | Chang | H10B 51/30 |
| 2017/0358684 A1* | 12/2017 | Chen | H01L 29/40111 |
| 2018/0122634 A1* | 5/2018 | Bu | H01L 21/02675 |
| 2019/0027700 A1* | 1/2019 | Shimizu | H10K 71/12 |
| 2019/0043991 A1* | 2/2019 | Tan | H01L 29/42324 |
| 2019/0115354 A1* | 4/2019 | Tan | H01L 29/42324 |
| 2019/0198617 A1* | 6/2019 | Li | H01L 29/40111 |
| 2019/0198673 A1* | 6/2019 | Liu | H01L 29/516 |
| 2020/0027897 A1* | 1/2020 | Zhu | H10B 53/20 |
| 2020/0119047 A1* | 4/2020 | Yoo | H10B 51/30 |
| 2020/0328287 A1* | 10/2020 | Chen | H01L 29/516 |
| 2021/0005728 A1* | 1/2021 | Cheng | H01L 29/517 |
| 2021/0020427 A1* | 1/2021 | Rozen | H01L 21/02183 |
| 2021/0057581 A1* | 2/2021 | Lin | H01L 29/66795 |
| 2021/0242225 A1* | 8/2021 | Manfrini | H10B 53/00 |
| 2021/0358694 A1* | 11/2021 | Lee | G11C 11/2275 |
| 2022/0085043 A1* | 3/2022 | Zhu | H01L 29/7827 |
| 2022/0102558 A1* | 3/2022 | Yamaguchi | H01L 29/516 |
| 2022/0189546 A1* | 6/2022 | Gong | H10B 51/30 |

* cited by examiner

SEMICONDUCTOR DEVICE INCLUDING FERROELECTRIC LAYER AND INSULATION LAYER WITH METAL PARTICLES AND METHODS OF MANUFACTURING THE SAME

CROSS-REFERENCE TO RELATED APPLICATIONS

The present application claims priority under 35 U.S.C. § 119(a) to Korean Application No. 10-2021-0126756, filed on Sep. 24, 2021 in the Korean Intellectual Property Office, which is incorporated herein by reference in its entirety.

BACKGROUND

1. Technical Field

The present disclosure generally relates to a semiconductor device including a ferroelectric layer.

2. Related Art

In general, a ferroelectric material may refer to a material having spontaneous electrical polarization in a state in which an external electric field is not applied. In addition, a ferroelectric material may exhibit a polarization hysteresis behavior that varies according to an externally applied electric field. Accordingly, it is possible to enable the ferroelectric material to have one of two stable, but reversible, remanent polarization states on the polarization hysteresis curve by controlling the applied electric field. The ability of a ferroelectric material to store reversible remanent polarization states is feature that can be applied to the storage of non-volatile signal information, such as "0" and "1".

Recently, research is being conducted on field effect transistor-type nonvolatile memory devices in which ferroelectric material is used in gate dielectric layers. A write operation of a nonvolatile memory device may be performed by providing a write voltage to the nonvolatile memory device to write different remanent polarization states to a gate dielectric layer as logic information. A read operation of a nonvolatile memory device utilizes the resistance of a channel layer of the field effect transistor, which changes according to the orientation and size of the remanent polarization written in the gate dielectric layer. That is, a read operation of a nonvolatile memory device may be performed by providing a read voltage to the nonvolatile memory device to read a channel current of the field effect transistor.

SUMMARY

A semiconductor device according to an embodiment of the present disclosure may include a substrate, a ferroelectric layer disposed on the substrate, a gate insulation layer disposed on the ferroelectric layer, metal particles disposed in the gate insulation layer, and a gate electrode layer disposed on the gate insulation layer.

A semiconductor device according to another embodiment of the present disclosure may include a substrate, a channel layer disposed on the substrate, a ferroelectric layer disposed on the channel layer, a gate insulation layer disposed on the ferroelectric layer, metal particles disposed in the gate insulation layer, a gate electrode layer disposed on the gate insulation layer, and a source electrode layer and a drain electrode layer over the substrate. The source electrode layer and the drain electrode layer are disposed over the substrate to respectively contact opposite ends of the channel layer.

In a method of manufacturing a semiconductor device according to another embodiment of the present disclosure, a substrate may be provided. A ferroelectric layer may be formed on the substrate. A first insulation layer may be formed on the ferroelectric layer. Metal particles may be distributed on the first insulation layer. A second insulation layer may be formed to cover the metal particles over the first insulation layer. A gate electrode layer may be formed on the second insulation layer.

A semiconductor device according to yet another embodiment of the present disclosure may include a substrate, a gate structure including a hole pattern disposed over the substrate, a gate insulation layer disposed on a sidewall surface of the gate structure exposed by the hole pattern, metal particles distributed in the gate insulation layer, a ferroelectric layer disposed on the gate insulation layer, and a channel layer disposed on the ferroelectric layer. The gate structure may include gate electrode layers and interlayer insulation layers that are alternately stacked.

DETAILED DESCRIPTION

Figure 1:
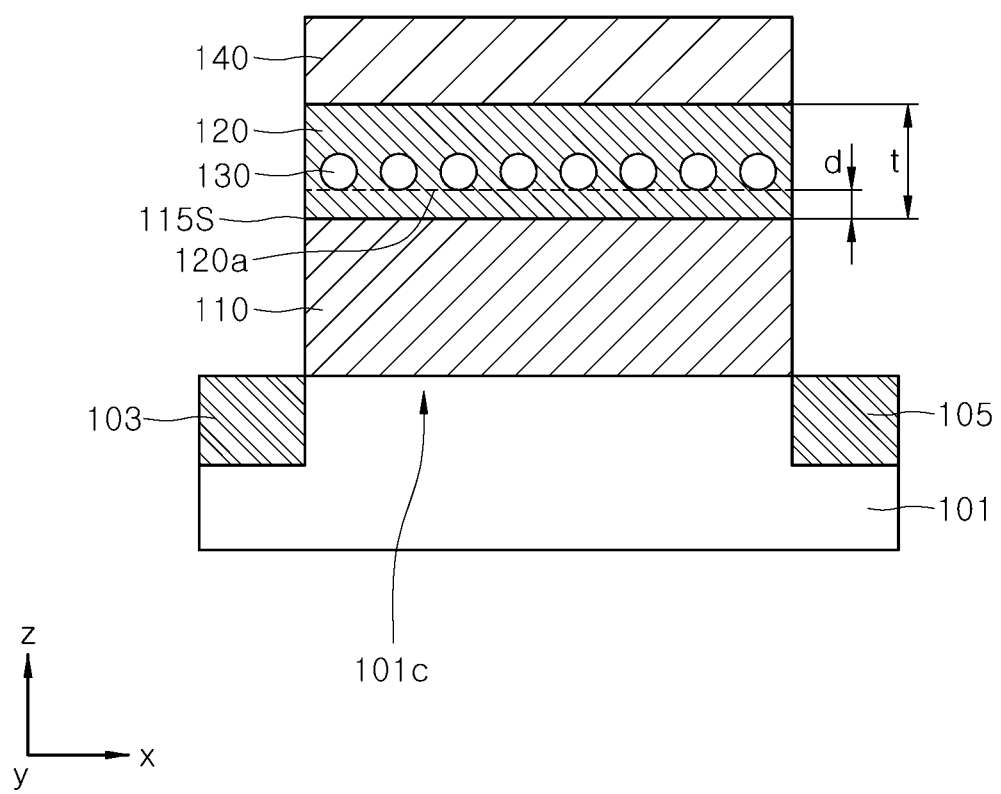
FIG. 1 is a schematic cross-sectional view illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as the stated order, and may be performed substantially at the same time. Also, at least a part of each of the above processes may be performed in a reversed order.

FIG. 1 is a schematic cross-sectional view illustrating a semiconductor device according to an embodiment of the present disclosure. Referring to FIG. 1, a semiconductor device 1 may include a substrate 101, a ferroelectric layer 110 disposed on the substrate 101, a gate insulation layer 120 disposed on the ferroelectric layer 110, metal particles 130 disposed in an inner region of the gate insulation layer 120, and a gate electrode layer 140 disposed on the gate insulation layer 120. In addition, the semiconductor device 1 may further include a source region 103 and a drain region 105, which are disposed in regions of the substrate 101 opposite to each other (e.g., in an x-direction) with respect to the gate electrode layer 140.

The substrate 101 may include a semiconductor material. As an example, the semiconductor material may include silicon (Si), germanium (Ge), gallium arsenide (GaAs), or the like. The substrate 101 may be doped with an N-type or P-type dopant to have electrical conductivity.

The source region 103 and the drain region 105 may be disposed to be spaced apart from each other in the x-direction. Each of the source region 103 and the drain region 105 may be a region of the substrate 101 doped with a dopant that is different from the dopant in the remainder of the substrate 101. For example, when the substrate 101 is doped with a P-type dopant, the source region 103 and the drain region 105 may be doped with an N-type dopant. In another example, when the substrate 101 is doped with an N-type dopant, the source region 103 and the drain region 105 may be doped with a P-type dopant.

A channel region 101c may be disposed in a region of the substrate 101 between the source region 103 and the drain region 105. The channel region 101c may be located adjacent to an upper surface of the substrate 101 and directly under the ferroelectric layer 110. A conductive channel electrically connecting the source region 103 and the drain region 105 to each other may be formed in the channel region 101c according to a voltage applied to the gate electrode layer 140. An electrical resistance of the conductive channel may vary depending on a magnitude and orientation of remanent polarization stored in the ferroelectric layer 110.

The ferroelectric layer 110 may be disposed on or over the substrate 101, for example in a vertical or z-direction. The ferroelectric layer 110 may include a ferroelectric material. The ferroelectric material may have spontaneous electrical polarization. The ferroelectric material may exhibit hysteresis behavior with respect to polarization based on a write voltage applied between the gate electrode layer 140 and the substrate 101. The ferroelectric material may have predetermined polarization according to a polarization hysteresis curve in response to the write voltage. Even after the write voltage is removed, the ferroelectric material may maintain the remanent polarization corresponding to the predetermined polarization. The remanent polarization may function as signal information in the semiconductor device 1 and may be stored in a non-volatile manner in the ferroelectric layer 110. That is, the ferroelectric layer 110 may function as a memory layer of the semiconductor device 1.

In an embodiment, the ferroelectric layer 110 may include metal oxide having a crystal structure of an orthorhombic system as the ferroelectric material. The metal oxide may include, for example, hafnium oxide, zirconium oxide, hafnium zirconium oxide, or a combination of two or more thereof. In an embodiment, the ferroelectric layer 110 may include a dopant that is doped into the ferroelectric material. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), lanthanum (La), or a combination thereof. In an embodiment, the dopant may help the ferroelectric layer 110 maintain the crystal structure of an orthorhombic system, thereby stabilizing the ferroelectric properties of the ferroelectric layer 110.

In another embodiment, the ferroelectric layer 110 may include metal oxide having a perovskite structure as the ferroelectric material. The metal oxide may include, for example, barium titanium oxide ($BaTiO_3$), lead titanium oxide ($PbTiO_3$), barium strontium titanium oxide (($Ba,Sr$)$TiO_3$, BST), lithium niobium oxide ($LiNbO_3$), or the like.

Referring to FIG. 1, the gate insulation layer 120 may be disposed on the ferroelectric layer 110. The gate insulation layer 120 may include a dielectric material. The gate insulation layer 120 may have a non-ferroelectric property. Here, a non-ferroelectric property may mean an absence of ferroelectricity, and may mean, for example, paraelectricity or antiferroelectricity. The gate insulation layer 120 may include, for example, oxide, nitride, oxynitride, or a combination of two or more thereof. Specifically, the gate insulation layer 120 may include silicon oxide, silicon nitride, silicon oxynitride, aluminum oxide, hafnium oxide, zirconium oxide, yttrium oxide, or the like. The gate insulation layer 120 may be thinner than the ferroelectric layer 110.

The hafnium oxide and the zirconium oxide used in the gate insulation layer 120 may each have a crystal structure of a monoclinic crystal system or a tetragonal crystal system, and as a result may exhibit non-ferroelectric properties. On the other hand, the hafnium oxide and the zirconium oxide used in the ferroelectric layer 110 may each have a crystal structure of an orthorhombic crystal system and thereby exhibit ferroelectricity.

In an embodiment, the permittivity of the gate insulation layer 120 may be lower than that of the ferroelectric layer 110. For example, the permittivity of the dielectric material constituting the gate insulation layer 120 may be lower than that of the ferroelectric material constituting the ferroelectric layer 110.

Referring to FIG. 1, the metal particles 130 may be embedded in an inner region of the gate insulation layer 120. The metal particles 130 may be distributed on an upper side of a plane 120a spaced apart from an interface 115S between the ferroelectric layer 110 and the gate insulation layer 120 by a distance d. The plane 120*a* on which the metal particles 130 are distributed may be parallel to the interface 115S between the ferroelectric layer 110 and the gate insulation layer 120.

In an embodiment, the distance d may be, for example, greater than 0 and less than or equal to half (½) of a thickness t of the gate insulation layer 120. Accordingly, the metal particles 130 may be disposed closer to the ferroelectric layer 110 than the gate electrode layer 140 with respect to the z-direction, or the metal particles 130 may be arranged equidistant from the gate electrode layer 140 and the ferroelectric layer 110 with respect to the z-direction. In some embodiments, the metal particles do not contact an interface between the gate insulation layer 120 and either the ferroelectric layer 110 or the gate electrode layer 140. The metal particles may be entirely embedded within the gate insulation layer.

The metal particles 130 may have a form in which metal atoms are aggregated. The metal particles 130 may each have a spherical or sphere-like shape. However, the present disclosure is not necessarily limited thereto, and other three-dimensional shapes are possible. In an embodiment, a diameter of the metal particle 130 having a spherical shape may have a size of 0.1 nanometers (nm) to 5 nm, for example. The metal particles 130 may include, for example, cobalt (Co), nickel (Ni), copper (Cu), iron (Fe), platinum (Pt), gold (Au), silver (Ag), iridium (Ir), ruthenium (Ru), palladium (Pd), manganese (Mn), or a combination of two or more thereof. As will be described later with reference to FIGS. 2A to 2D, the metal particles 130 may function as trap sites that trap or de-trap electrons during an operation of the semiconductor device.

Referring to FIG. 1 again, the gate electrode layer 140 may be disposed on the gate insulation layer 120. The gate electrode layer 140 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In some embodiments, although not illustrated in FIG. 1, an interfacial insulation layer may be additionally disposed between the substrate 101 and the ferroelectric layer 110. The interfacial insulation layer may function as a buffer layer for alleviating a lattice constant difference between the substrate 101 and the ferroelectric layer 110.

As described above, the semiconductor device 1 according to an embodiment of the present disclosure may be a nonvolatile memory device in the form of a field effect transistor including the ferroelectric layer 110 and the gate insulation layer 120. The semiconductor device 1 may include the metal particles 130 disposed in an inner region of the gate insulation layer 120. As will be described in connection with FIGS. 2A to 2D, and 3, the embedded metal particles 130 may increase the operation voltage range of the semiconductor device 1, that is, a memory operation window, by trapping or de-trapping electrons.

In addition, the metal particles 130 may generate strain inside the gate insulation layer 120. The strain may generate a flexoelectric effect in the gate insulation layer 120. The flexoelectric effect may improve the degree of polarization alignment of the gate insulation layer 120 along an external electric field when the external electric field is applied to the gate insulation layer 120. As the alignment degree of the polarization is improved, the permittivity of the gate insulation layer 120 may increase. As a result, the capacitance of the gate insulation layer 120 may be improved.

Referring to FIG. 1 again, the ferroelectric layer 110 and the gate insulation layer 120 may be electrically connected in series to each other between the substrate 101 and the gate electrode layer 140. Accordingly, when an operation voltage V is applied between the substrate 101 and the gate electrode layer 140, the product of a capacitance C110 (not illustrated) of the ferroelectric layer 110 and a voltage V110 (not illustrated) applied to the ferroelectric layer 110 may be equal to the product of a capacitance C120 (not illustrated) of the gate insulation layer 120 and a voltage V120 (not illustrated) applied to the gate insulation layer 120.

$$C110 * V110 = C120 * V120 \quad (1)$$

When Equation (1) holds, if the capacitance of the gate insulation layer 120 increases according to an embodiment of the present disclosure, the voltage V120 applied to the gate insulation layer 120 may decrease, and instead, the voltage V110 applied to the ferroelectric layer 110 may increase.

Accordingly, when the operation voltage V is applied between the substrate 101 and the gate electrode layer 140, the magnitude of the voltage V120 distributed to the gate insulation layer 120 having a smaller thickness than the ferroelectric layer 110 decreases, so that a breakdown voltage of the semiconductor device 1 by the operation voltage V may be improved. In addition, when the operation voltage V is applied, the magnitude of the voltage V110 distributed to the ferroelectric layer 110 increases, so that the alignment degree of the polarization written in the ferroelectric layer 110 may be improved. Additionally, the magnitude of the voltage V120 applied to the gate insulation layer 120 decreases, so that charge injection (e.g., electron inflow) from the gate insulation layer 120 to the ferroelectric layer 110 may decrease. In a comparative example, electrons flowing into the ferroelectric layer 110 from the gate insulation layer 120 may be pinned to ferroelectric domains or defect sites inside the ferroelectric layer 110, thereby preventing polarization switching of the ferroelectric layer 110. Accordingly, the ferroelectric properties of the ferroelectric layer 110 may deteriorate. In an embodiment of the present disclosure, in contrast, the charge injection from the gate insulation layer 120 to the ferroelectric layer 110 is reduced, so the endurance of the ferroelectric layer 110 improves, thereby improving the reliability of the semiconductor device.

FIGS. 2A to 2D are schematic cross-sectional views illustrating operations of a semiconductor device according to an embodiment of the present disclosure. FIG. 3 is a schematic graph illustrating hysteresis behavior of a ferroelectric layer during operations of a semiconductor device according to an embodiment of the present disclosure. The operations of a semiconductor device in connection with FIGS. 2A to 2D, and 3 may be described using a semiconductor device 1 described above with reference to FIG. 1.

Figure 2A:
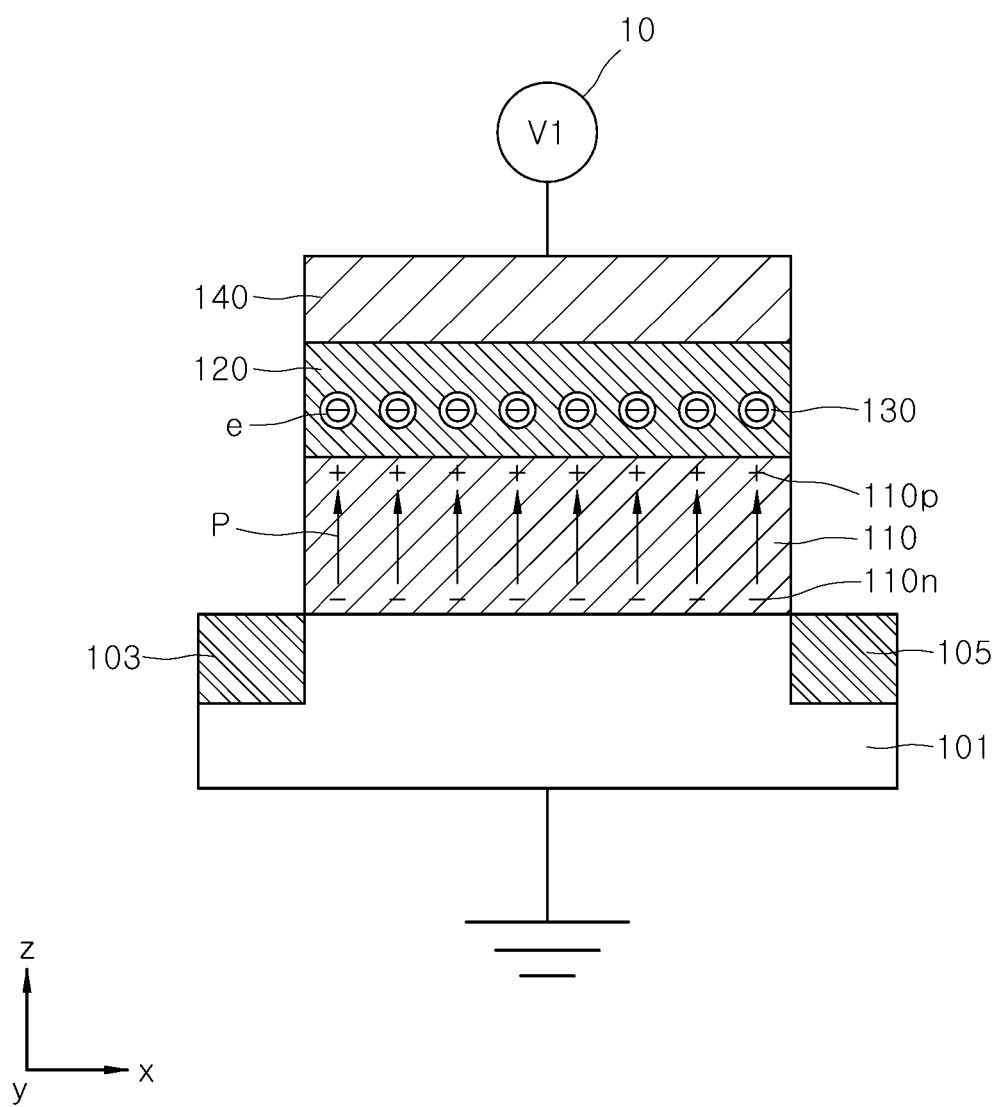
FIGS. 2A to 2D are schematic cross-sectional views illustrating operations of a semiconductor device according to an embodiment of the present disclosure.
Figure 3:
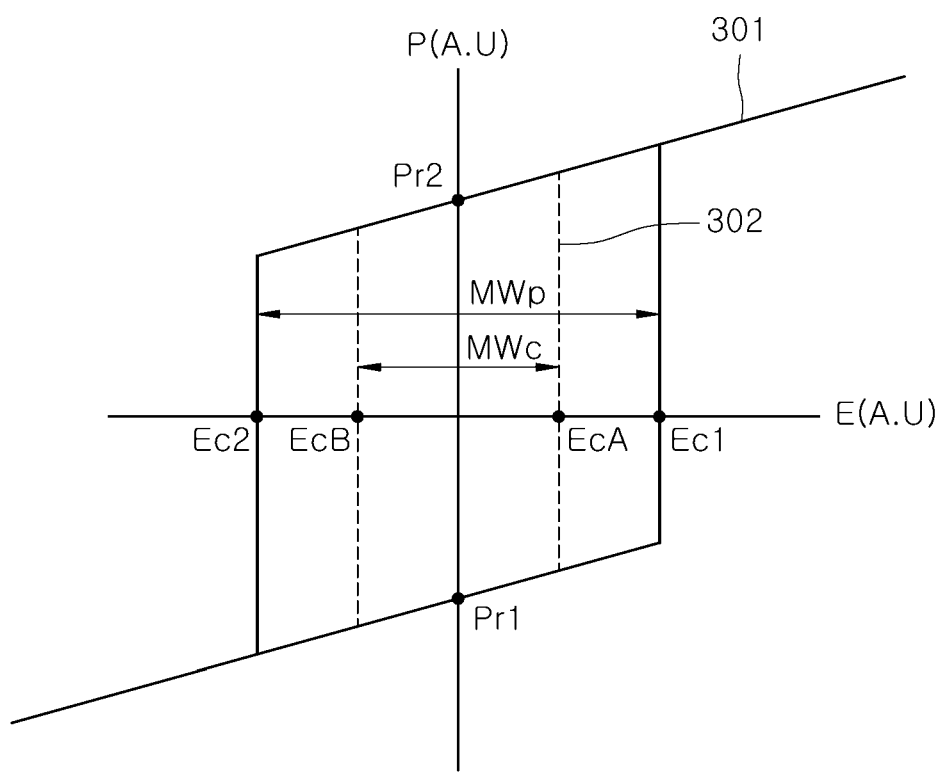
FIG. 3 is a schematic graph illustrating hysteresis behavior of a ferroelectric layer during operations of a semiconductor device according to an embodiment of the present disclosure.

Referring to FIG. 2A, a first write operation may be performed with respect to a semiconductor device 1. The first write operation may be performed by applying a first write voltage V1 between the substrate 101 of the semiconductor device 1 and the gate electrode layer 140 using a power supply 10. The substrate 101 may include a doped semiconductor material to have conductivity.

The method of applying the first write voltage V1 may be performed by applying a bias having a negative polarity to the gate electrode layer 140 while grounding the substrate 101. Accordingly, polarization P in the ferroelectric layer 110 may be aligned in a direction and may have a polarization orientation toward the gate electrode layer 140 from the substrate 101. In addition, when the first write operation is in progress, electrons e injected from the gate electrode layer 140 and moving to the ferroelectric layer 110 may be trapped by the metal particles 130. Subsequently, after the first write operation is completed, the applied first write voltage V1 may be removed from the semiconductor device 1.

Meanwhile, compared to a semiconductor device without the metal particles in a gate insulation layer, according to an embodiment of the present disclosure including the metal particles 130, the first write voltage V1 applied to the semiconductor device 1 may be relatively greater in magnitude during the first write operation. When the first write operation is performed, the magnitude of the first write voltage V1 may increase to facilitate the trapping the electrons e in the metal particles 130. When the magnitude of the first write operation voltage V1 increases, the memory operation window of a semiconductor device 1 may increase, as will be described later with reference to FIG. 3.

Figure 2B:
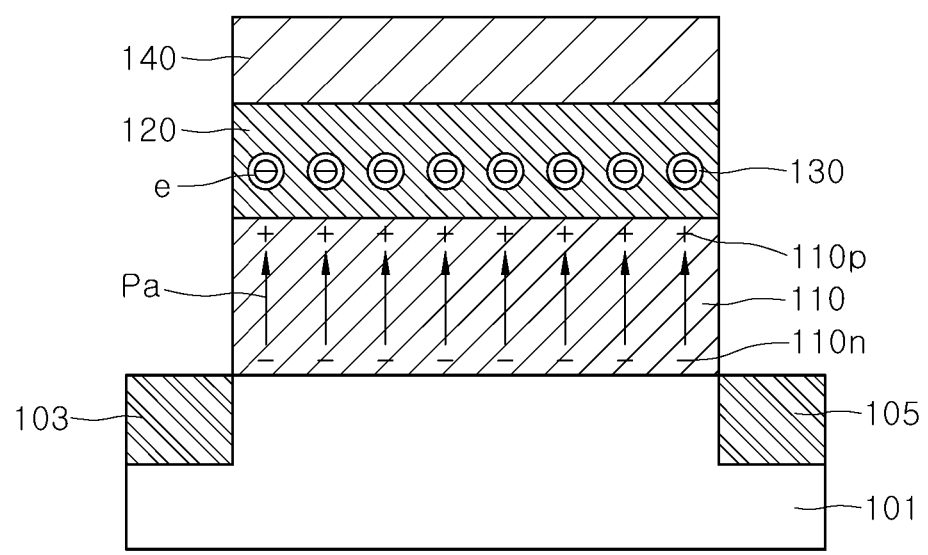
Figure 2B:
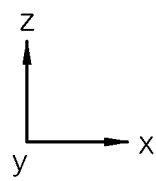

Referring to FIG. 2B, after the first write voltage V1 is removed, first remanent polarization Pa may be aligned inside the ferroelectric layer 110. The first remanent polarization Pa as illustrated in FIG. 2B may have substantially the same polarization orientation as the polarization P generated by the first write voltage V1 as illustrated in FIG. 2A. Due to the first remanent polarization Pa in the ferroelectric layer 110, negative charges 110n may be distributed in an inner region of the ferroelectric layer 110 adjacent to the substrate 101, while positive charges 110p may be distributed in an inner region of the ferroelectric layer 110 adjacent to the gate insulation layer 120.

Figure 2C:
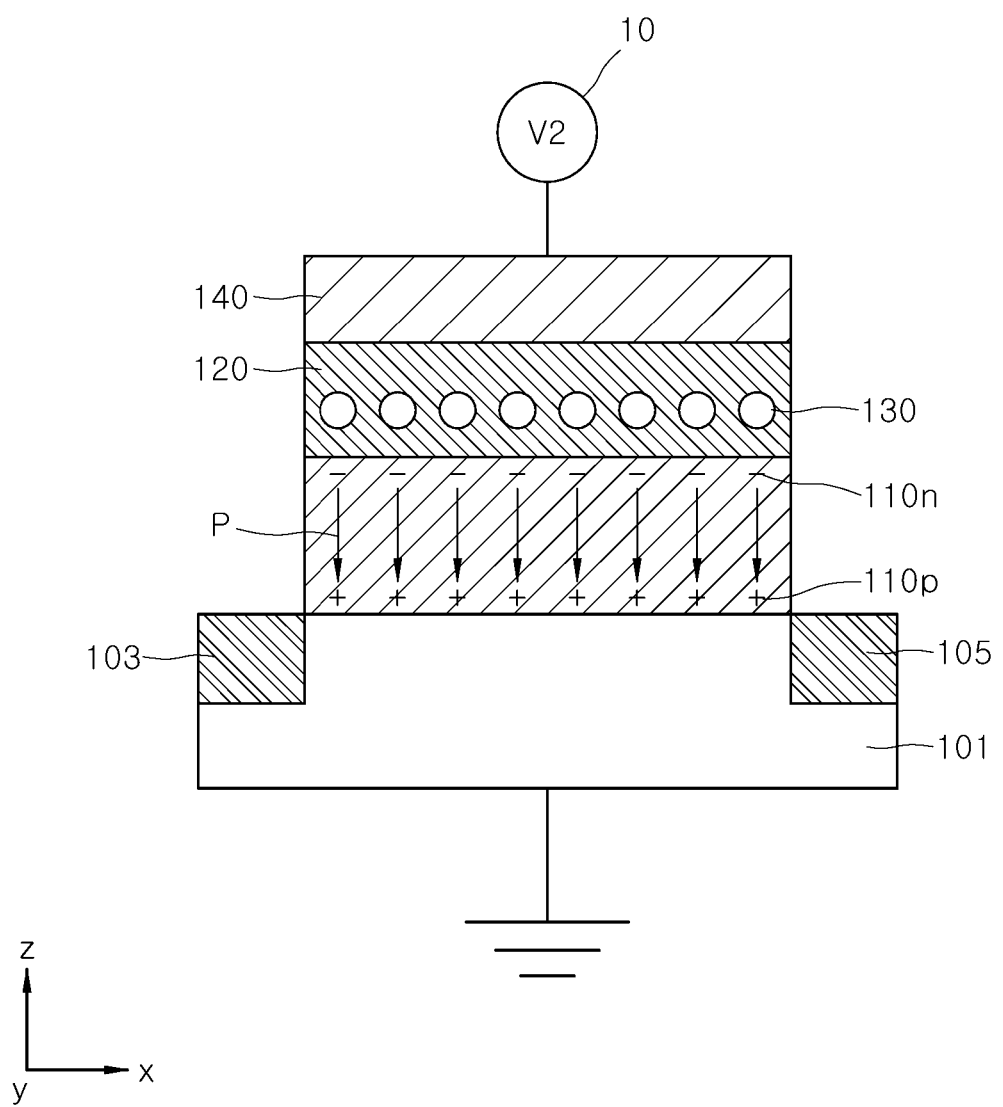

Referring to FIG. 2C, a second write operation may be performed to the semiconductor device 1 in which the first remanent polarization Pa is stored. The second write operation may be performed by applying a second write voltage V2 between the substrate 101 and the gate electrode layer 140 of the semiconductor device 1 using the power supply 10. The method of applying the second write voltage V2 may be performed by applying a bias having a positive polarity to the gate electrode layer 140 while grounding the substrate 101. Accordingly, a polarization P in the ferroelectric layer 110 may be aligned in a direction along an electric field formed by the second write voltage V2. Under the second write voltage V2, the polarization P may have a polarization orientation toward the substrate 101 from the gate electrode layer 140, which is the opposite of polarization P under the first write voltage V1 with an opposite polarity. In addition, during the second write operation, the electrons e trapped in the metal particles 130 may detach from the metal particles 130 and move towards the gate electrode layer 140. Subsequently, after the second write operation is completed, the applied second write voltage V2 may be removed from the semiconductor device 1.

Referring to FIG. 2C, when forming a polarization P inside the ferroelectric layer 110 by applying a second write voltage V2, the applied second write voltage V2 needs to overcome any potential formed by the electrons e trapped in the metal particles 130 before a second write operation can be accomplished. Accordingly, compared to a case in which metal particles are not present inside the gate insulation layer, according to the present embodiment in which metal particles 130 are present inside the gate insulation layer 120, the second write voltage V2 applied to the semiconductor device 1 may have an increased magnitude in order to perform the second write operation. When the magnitude of the second write operation V2 increases, the memory operation window of the semiconductor device 1 may also increase, as will be described later with reference to FIG. 3.

Figure 2D:
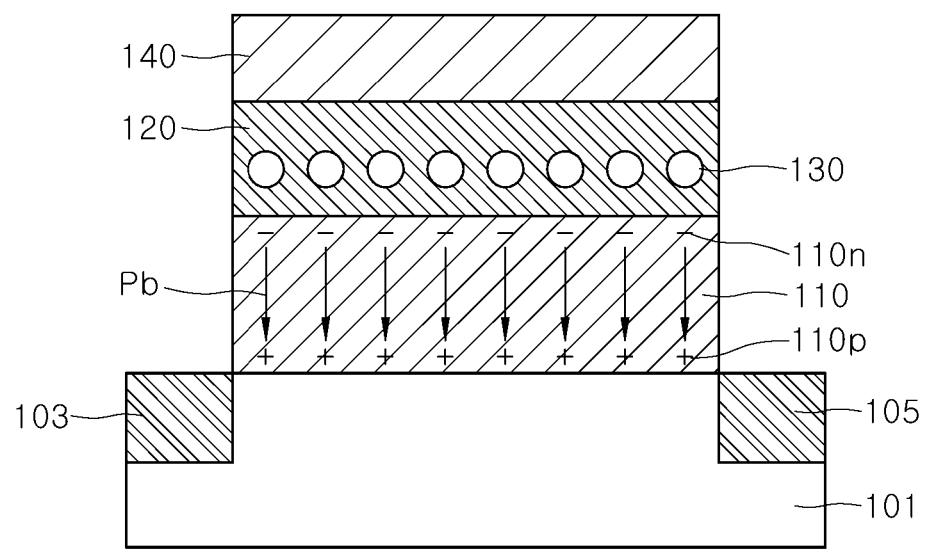

Referring to FIG. 2D, after the second write voltage V2 is removed, second remanent polarization Pb may be aligned inside the ferroelectric layer 110. The second remanent polarization Pb may have a polarization orientation substantially the same as that of the polarization P that resulted from application of the second write voltage V2. Under the second remanent polarization Pb, positive charges 110p in the ferroelectric layer 110 may be distributed in an inner region adjacent to the substrate 101, and negative charges 110n may be distributed in an inner region adjacent to the gate insulation layer 120.

FIG. 3 illustrates a first hysteresis graph 301 and a second hysteresis graph 302 of different semiconductor devices, respectively. The first hysteresis graph 301 may be a graph obtained from a semiconductor device 1 of FIG. 1 according to an embodiment of the present disclosure, in which a gate insulation layer 120 includes the metal particles 130. The second hysteresis graph 302 may be a graph obtained from a semiconductor device in a comparative example that does not include metal particles inside an analogous gate insulation layer.

The first hysteresis graph 301 may include first and second remanent polarization Pr1 and Pr2 and first and second coercive fields Ec1 and Ec2. The second hysteresis graph 302 may include the first and second remanent polarization Pr1 and Pr2 and third and fourth coercive fields EcA and EcB. Here, the first and second remanent polarization Pr1 and Pr2 of the first hysteresis graph 301 and the first and second remanent polarization Pr1 and Pr2 of the second hysteresis graph 302 may be the same. The first remanent polarization Pr1 may correspond to the first remanent polarization Pa of FIG. 2B, and the second remanent polarization Pr2 may correspond to the second remanent polarization Pb of FIG. 2D.

The first hysteresis graph 301 may have a greater memory operation window. A memory operation window corresponds to a width between a pair of coercive fields. That is, the first memory operation window MWp of the first hysteresis graph 301 between first and second coercive fields Ec1 and Ec2 may be greater than the second memory operation window MWc of the second hysteresis graph 302 between third and fourth coercive fields EcA and EcB. The difference in the sizes of the first and second memory operation windows may be due to the greater magnitude of the first write voltage V1, which increases in order to additionally perform an operation of trapping electrons e in the metal particles 130 of the gate insulation layer 120 when the first write operation is in progress (see FIG. 2A). In addition, the difference in the sizes of the first and second memory operation windows may also result from the greater magnitude of the second write voltage V2, which increases in order to overcome the potential formed by the electrons e trapped in the metal particles 130 of the gate insulation layer 120 during the second write operation (see FIG. 2C). As a result, compared to the second hysteresis graph 302, the first hysteresis graph 301 reflects a greater the operation voltage range of the semiconductor device because the memory operation window may be increased from the comparative example. As the memory operation window increases, in a semiconductor device that stores multi-level remanent polarization as signal information, a voltage interval between a plurality of write voltages may be increased. As a result, signal errors between the multi-level remanent polarization written by the plurality of write voltages may be reduced. Accordingly, the memory operation reliability of the semiconductor device may be improved.

Figure 4:
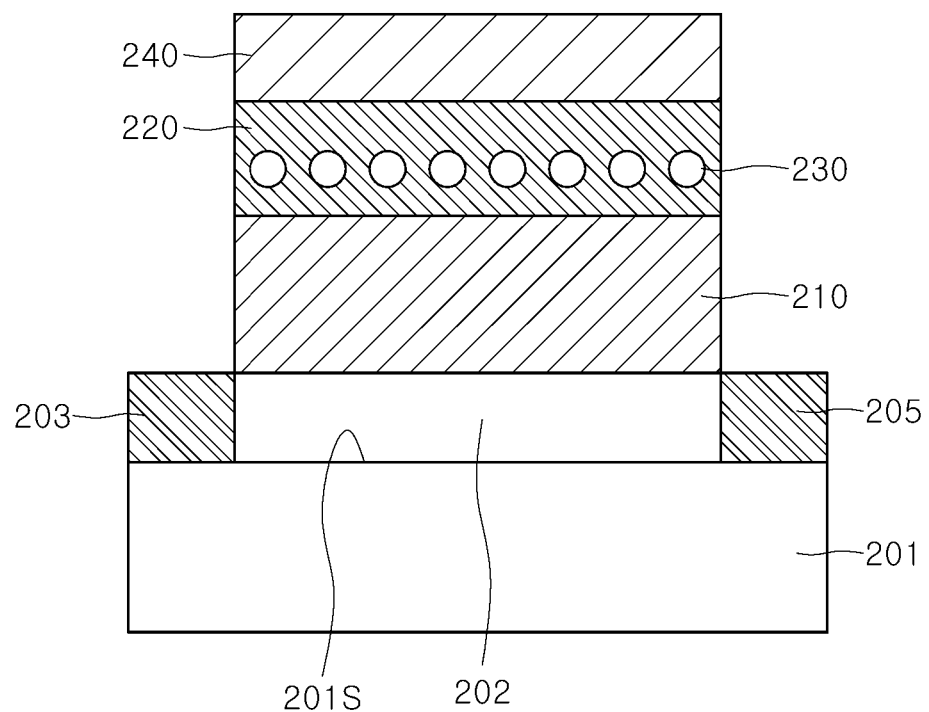
FIG. 4 is a schematic cross-sectional view illustrating a semiconductor device according to another embodiment of the present disclosure.

FIG. 4 is a schematic cross-sectional view illustrating a semiconductor device according to another embodiment of the present disclosure. Referring to FIG. 4, a semiconductor device 2 may further include a channel layer 202 disposed between a substrate 201 and a ferroelectric layer 210, compared to a semiconductor device 1 of FIG. 1. In addition, in the semiconductor device 2, a source electrode layer 203 and a drain electrode layer 205 corresponding to the source region 103 and the drain region 105 of the semiconductor device 1 may be disposed on a substrate 201.

The semiconductor device 2 may include the substrate 201, the channel layer 202 disposed on the substrate 201, the ferroelectric layer 210 disposed on the channel layer 202, a gate insulation layer 220 disposed on the ferroelectric layer 210, metal particles 230 disposed in an inner region of the gate insulation layer 220, and a gate electrode layer 240 disposed on the gate insulation layer 220. In addition, the semiconductor device 2 may include the source electrode layer 203 and the drain electrode layer 205 that are disposed to contact opposite ends of the channel layer 202, for example in the ex-direction.

The structures, materials, and arrangements of the substrate 201, the ferroelectric layer 210, the gate insulation layer 220, the metal particles 230, and the gate electrode layer 240 may be substantially the same as those of the substrate 101, the ferroelectric layer 110, the gate insulation layer 120, the metal particles 130, and the gate electrode layer 140 of FIG. 1. In some embodiments, the metal particles 230 do not contact an interface between the gate insulation layer 220 and either the ferroelectric layer 210 or the gate electrode layer 240. The metal particles 230 may be entirely embedded within the gate insulation layer.

Referring to FIG. 4, the channel layer 202 may include a semiconductor material. The semiconductor material may include, for example, silicon (Si), germanium (Ge), gallium arsenide (GaAs), or the like. As another example, the semiconductor material may include a two-dimensional semiconductor material. The two-dimensional semiconductor material may include transition metal dichalcogenide (TMDC), black phosphorus, or the like. The transition metal dichalcogenide (TMDC) may include, for example, molybdenum selenide ($MoSe_2$), hafnium selenide ($HfSe_2$), indium selenide (InSe), gallium selenide (GaSe), or the like. The semiconductor material may include, for example, metal oxide such as indium-gallium-zinc oxide (IGZO). The channel layer 202 may have conductivity. As an example, the channel layer 202 may be doped with an n-type or p-type dopant.

In FIG. 4, the channel layer 202 is illustrated as in contact with the substrate 201, but the present disclosure might not necessarily be limited thereto. In some embodiments, various functional layers may be disposed between the substrate 201 and the channel layer 202. As an example, at least one conductive pattern and at least one insulation pattern may be disposed between the substrate 201 and the channel layer 202.

In FIG. 4, the channel layer 202 is disposed on an upper side of surface 201S or a surface parallel to surface 201S of the substrate 201, but the present disclosure is not necessarily limited thereto. In some embodiments, the channel layer 202 may be disposed on a surface that is not parallel to the surface 201S of the substrate 201. A non-parallel surface may be, for example, an intersecting planar surface having a certain inclination angle with the surface 201S of the substrate 201. As an example, as described below with reference to FIGS. 15 and 16, a channel layer 350 may be disposed on a surface (i.e., y-z plane) substantially perpendicular to a surface 301S of a substrate 301. That is, the channel layer 350 may extend in a direction (i.e., z-direction) perpendicular to the surface 301S of the substrate 301.

The source electrode layer 203 and the drain electrode layer 205 may be disposed at opposite ends of the channel layer 202. Each of the source electrode layer 203 and the drain electrode layer 205 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Figure 5:
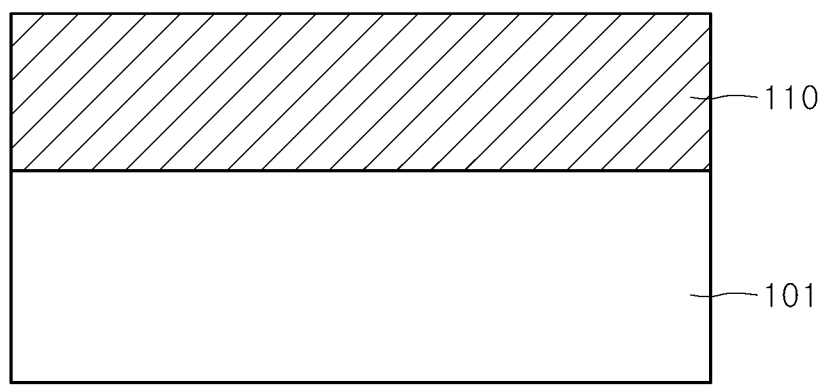
FIGS. 5 to 10 are schematic cross-sectional views illustrating a method of manufacturing a semiconductor device according to an embodiment of the present disclosure.

FIGS. 5 to 10 are schematic cross-sectional views illustrating a method of manufacturing a semiconductor device according to an embodiment of the present disclosure. Referring to FIG. 5, a substrate 101 may be provided. The substrate 101 may include a semiconductor material. As an example, the semiconductor material may include silicon (Si), germanium (Ge), gallium arsenide (GaAs), or the like. The substrate 101 may be doped with an N-type dopant or a P-type dopant to have electrical conductivity.

Next, a ferroelectric layer 110 may be formed on the substrate 101. The ferroelectric layer 110 may include a ferroelectric material. In an embodiment, the ferroelectric layer 110 may include metal oxide having a crystal structure of an orthorhombic system as the ferroelectric material. The metal oxide may include, for example, hafnium oxide, zirconium oxide, hafnium zirconium oxide, or a combination of two or more thereof. In an embodiment, the ferroelectric layer 110 may include a dopant that is doped in the ferroelectric material. The dopant may include, for example, carbon (C), silicon (Si), magnesium (Mg), aluminum (Al), yttrium (Y), nitrogen (N), germanium (Ge), tin (Sn), strontium (Sr), lead (Pb), Calcium (Ca), barium (Ba), titanium (Ti), gadolinium (Gd), lanthanum (La), or a combination thereof.

In another embodiment, the ferroelectric layer 110 may include metal oxide having a perovskite structure as the ferroelectric material. The metal oxide may include, for example, barium titanium oxide ($BaTiO_3$), lead titanium oxide ($PbTiO_3$), barium strontium titanium oxide (($Ba,Sr$)$TiO_3$, BST), lithium niobium oxide ($LiNbO_3$), or the like.

The ferroelectric layer 110 may be formed by, for example, applying a deposition method such as a chemical vapor deposition method or an atomic layer deposition method. The dopant may be implanted into the ferroelectric layer 110 using a deposition method while forming the ferroelectric layer 110.

Figure 6:
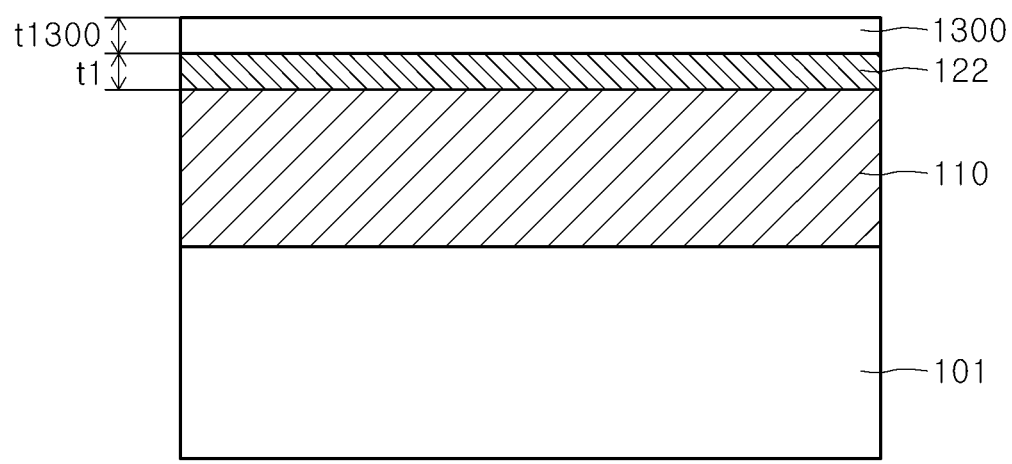
Figure 6:
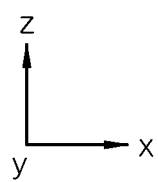

Referring to FIG. 6, a first insulation layer 122 may be formed on the ferroelectric layer 110. The first insulation layer 122 may have a first thickness t1 on the ferroelectric layer 110.

The first insulation layer 122 may include a dielectric material. The first insulation layer 122 may have a non-ferroelectric property. The first insulation layer 122 may include, for example, oxide, nitride, oxynitride, or a combination of two or more thereof. Specifically, the first insulation layer 122 may include silicon oxide, silicon nitride, silicon oxynitride, aluminum oxide, hafnium oxide, zirconium oxide, yttrium oxide, or the like. The first insulation layer 122 may be formed by, for example, using a chemical vapor deposition method, an atomic layer deposition method, or the like.

A metal thin film 1300 may be formed on the first insulation layer 122. The metal thin film 1300 may include, for example, cobalt (Co), nickel (Ni), copper (Cu), iron (Fe), platinum (Pt), gold (Au), silver (Ag), iridium (Ir), ruthenium (Ru), palladium (Pd), manganese (Mn), or a combination of two or more thereof.

The metal thin film 1300 may be formed to have a thickness t1300 of, for example, 0.1 nm to 3 nm. The metal thin film 1300 may be formed by, for example, using a chemical vapor deposition method, an atomic layer deposition method, or the like.

Figure 7:
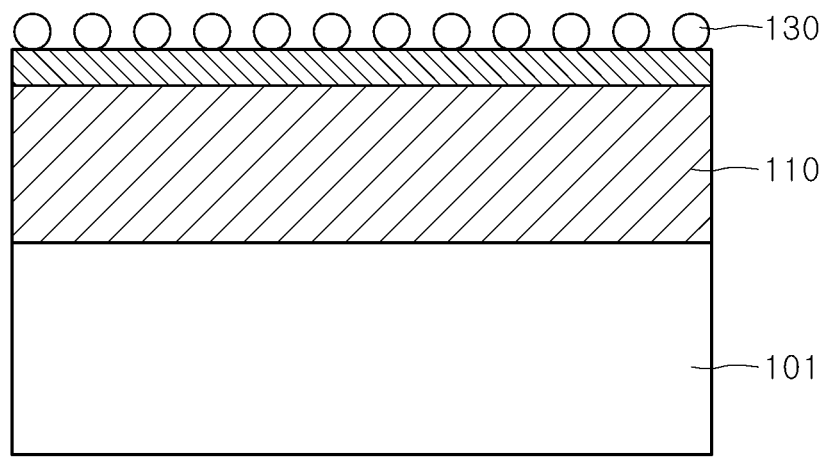

Referring to FIG. 7, the metal thin film (1300 of FIG. 6) formed on the first insulation layer (122 of FIG. 6) may self-aggregate and convert into a plurality of metal particles 130. In an embodiment, the self-aggregation of the metal thin film 1300 may occur simultaneously with the deposition of the metal thin film 1300 described with reference to FIG. 6. Alternatively, the self-aggregation of the metal thin film 1300 may result from performing a subsequent process such as heat treatment after the deposition of the metal thin film 1300 described with reference to FIG. 6.

The metal particles 130 may each have a shape in which metal atoms are aggregated. For example, each of the metal particles 130 may have a spherical or sphere-like shape. However, the present disclosure is not necessarily limited thereto, and other three-dimensional shapes are possible. In an embodiment, the diameter of a metal particle 130 having a spherical shape may have a size of 0.1 nm to 5 nm, for example. The metal particles 130 may be uniformly distributed on the first insulation layer 122.

Figure 8:
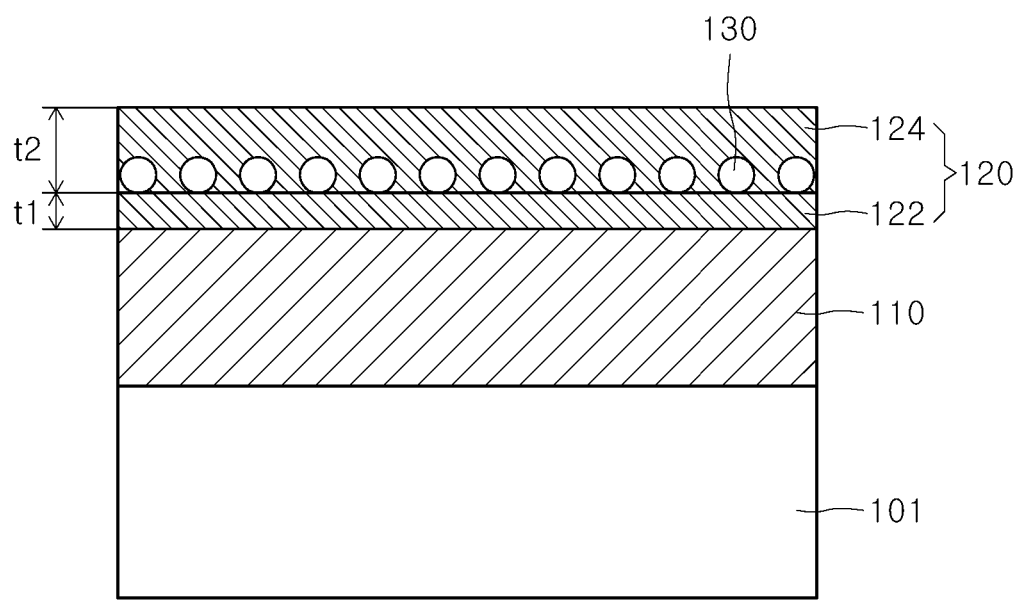

Referring to FIG. 8, a second insulation layer 124 may be formed to cover the particles 130 on the first insulation layer 122. The second insulation layer 124 may include a dielectric material having a non-ferroelectric property. The second insulation layer 124 may include, for example, oxide, nitride, oxynitride, or a combination of two or more thereof. In an embodiment, the second insulation layer 124 may be formed of the same material as the first insulation layer 122. The second insulation layer 124 may be formed by, for example, using a chemical vapor deposition method, an atomic layer deposition method, or the like.

In an embodiment, the second insulation layer 124 may be formed to have a second thickness t2 on the first insulation layer 122. The second thickness t2 of the second insulation layer 124 may be greater than or equal to the first thickness t1 of the first insulation layer 122. Meanwhile, the first insulation layer 122 and the second insulation layer 124 that are sequentially formed on the ferroelectric layer 110 may constitute a gate insulation layer 120.

Figure 9:
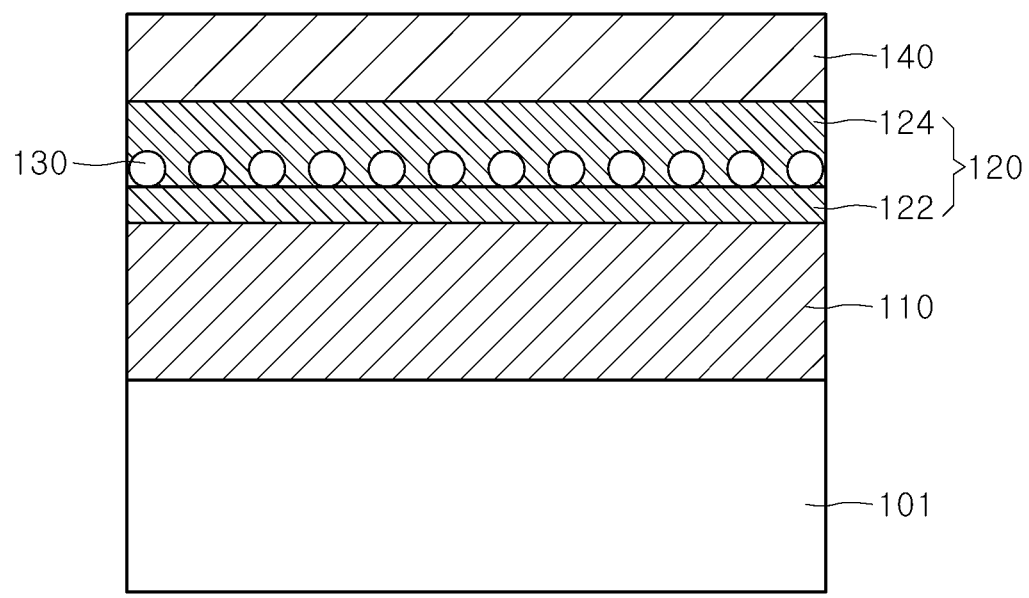

Referring to FIG. 9, a gate electrode layer 140 may be formed on the second insulation layer 124. The gate electrode layer 140 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The gate electrode layer 140 may be formed by, for example, using a chemical vapor deposition method, an atomic layer deposition method, or the like.

Figure 10:
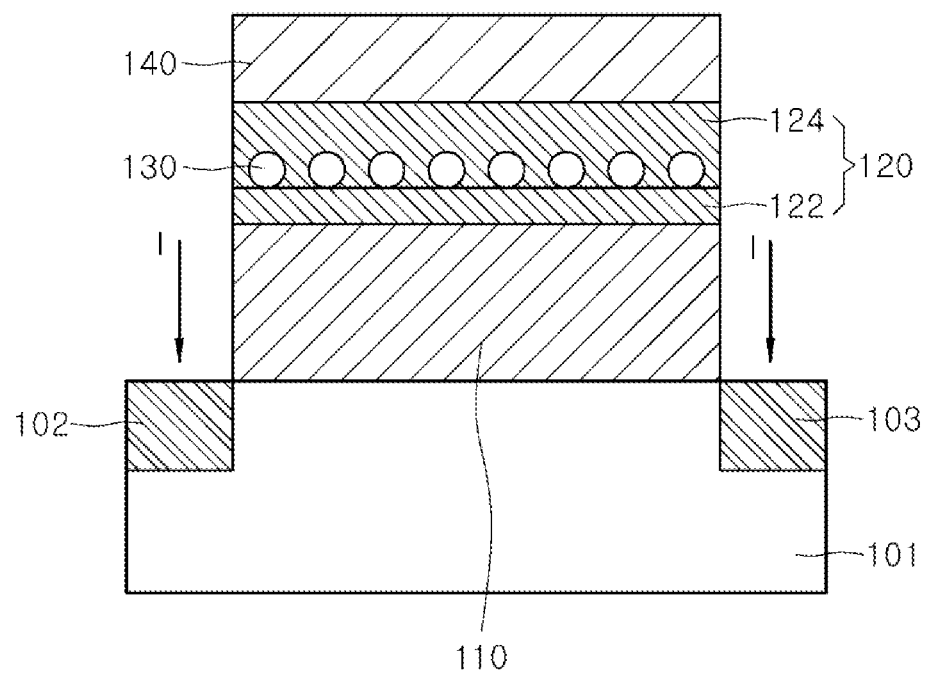

Referring to FIG. 10, the ferroelectric layer 110, the gate insulation 120, the metal particles 130, and the gate insulation layer 140 may be patterned over the substrate 101 to selectively expose the substrate 101. A photolithography process and an etching process may be used in a patterning method.

Next, a dopant I may be implanted into the exposed substrate 101 to form a source region 102 and a drain region 103. The doping type of each of the source region 102 and the drain region 103 may be different from the doping type of the substrate 101. As an example, when the substrate 101 is doped with a P-type dopant, the source region 102 and the drain region 103 may be doped with an N-type dopant. As a method of implanting the dopant I, an ion implantation method may be applied.

Although not illustrated, in some embodiments, an interfacial insulation layer may be additionally formed between the substrate 101 and the ferroelectric layer 110 in FIG. 5. The interfacial insulation layer may function as a buffer layer for alleviating a lattice constant difference between the substrate 101 and the ferroelectric layer 110. The interfacial insulation layer may include, for example, oxide, nitride, oxynitride, or the like. The interfacial insulation layer may be formed by, for example, using a chemical vapor deposition method, an atomic layer deposition method, or the like.

Through the above-described processes, semiconductor devices according to embodiments of the present disclosure may be manufactured. The above-described method of manufacturing a semiconductor device may be used in manufacturing a semiconductor device 1 of FIG. 1.

Figure 11:
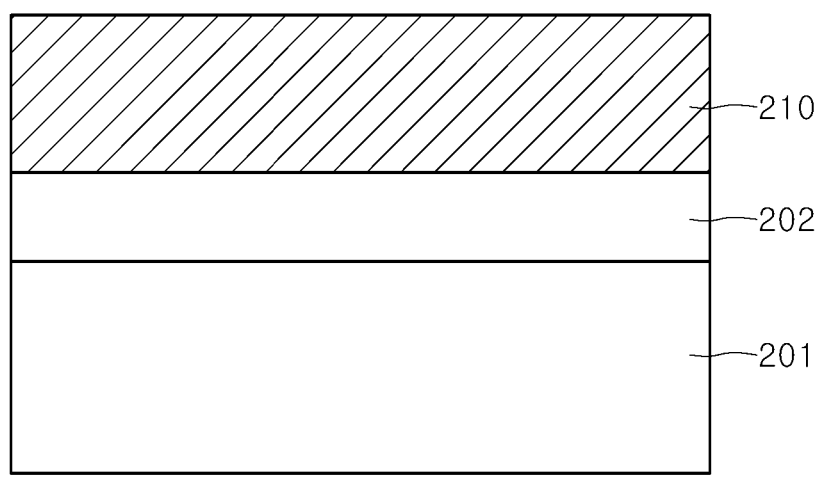
FIGS. 11 to 13 are schematic cross-sectional views illustrating a method of manufacturing a semiconductor device according to another embodiment of the present disclosure.
Figure 12:
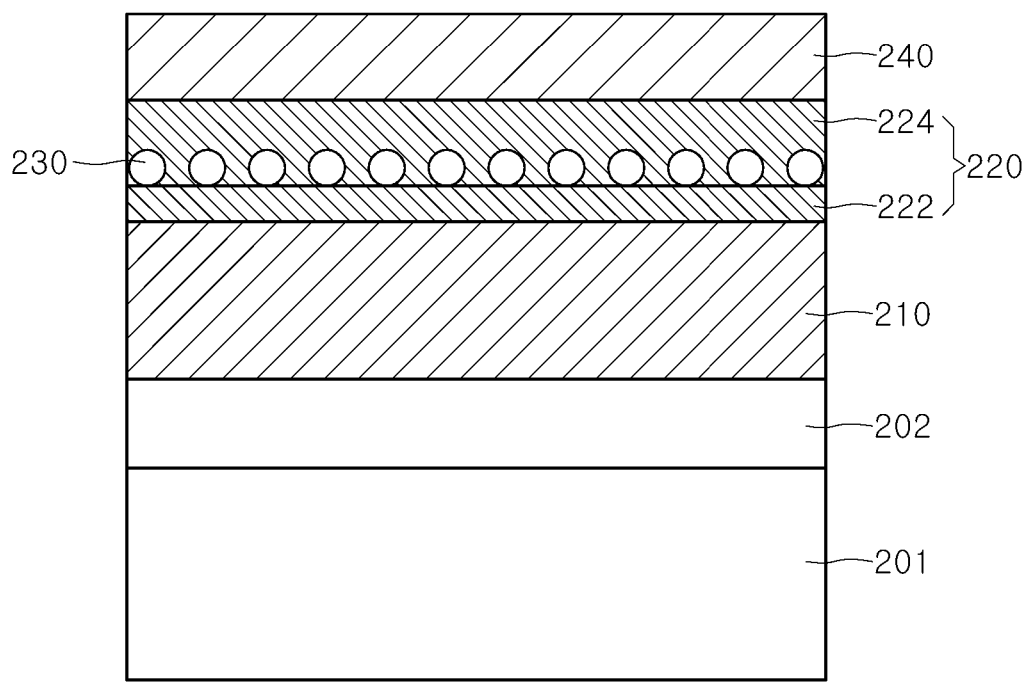
Figure 13:
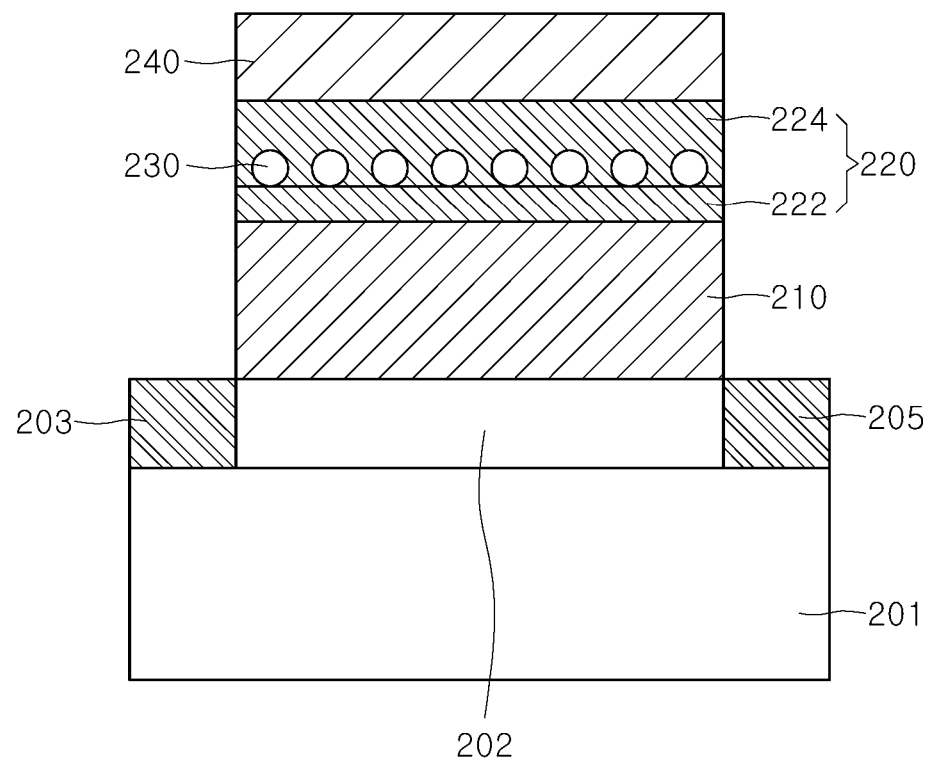

FIGS. 11 to 13 are schematic cross-sectional views illustrating a method of manufacturing a semiconductor device according to another embodiment of the present disclosure. The methods illustrated in FIGS. 11 to 13 may be applied to a method of manufacturing a semiconductor device 2 of FIG. 4.

Referring to FIG. 11, a substrate 201 may be provided. The substrate 201 may be substantially the same as the substrate 101 of FIG. 5. Alternatively, the substrate 201 may be an insulating substrate or a conductive substrate.

Next, a channel layer 202 may be formed on the substrate 201. The channel layer 202 may include a semiconductor material. The semiconductor material may include, for example, silicon (Si), germanium (Ge), gallium arsenide (GaAs), or the like. As another example, the semiconductor material may include a two-dimensional semiconductor material. The two-dimensional semiconductor material may include transition metal dichalcogenide (TMDC), black phosphorus, or the like. The transition metal chalcogenide may include, for example, molybdenum selenide ($MoSe_2$), hafnium selenide ($HfSe_2$), indium selenide (InSe), gallium selenide (GaSe), or the like. The semiconductor material may include, for example, metal oxide such as indium-gallium-zinc oxide (IGZO). The channel layer 202 may have conductivity. As an example, the channel layer 202 may be doped with an N-type dopant or a P-type dopant. The channel layer 202 may be formed by, for example, applying a chemical vapor deposition method, an atomic layer deposition method, or the like.

Subsequently, a ferroelectric layer 210 may be formed on the channel layer 202. The ferroelectric layer 210 may be substantially the same as a ferroelectric layer 110 of FIG. 5.

A method of forming the ferroelectric layer 210 may be substantially the same as the method of forming the ferroelectric layer 110 of FIG. 5.

Referring to FIG. 12, a first insulation layer 222, metal particles 230, a second insulation layer 224, and a gate electrode layer 240 may be sequentially formed over the ferroelectric layer 210. Methods of forming the first insulation layer 222, the metal particles 230, the second insulation layer 224, and the gate electrode layer 240 may be substantially the same as the methods of forming the first insulation layer 122, the metal particles 130, the second insulation layer 124, and the gate electrode layer 140 described above with reference to FIGS. 6 to 9. In this device, the first insulation layer 222 and the second insulation layer 224 may constitute a gate insulation layer 220.

Referring to FIG. 13, the channel layer 202, the ferroelectric layer 210, the first insulation layer 222, the metal particles 230, the second insulation layer 224, and the gate electrode layer 240 may be patterned over the substrate 201 to selectively expose the substrate 201. A patterning process may be, for example, a photolithography process and an etching process.

Then, a source electrode layer 203 and a drain electrode layer 205 may be formed on the exposed portions of the substrate 201. The source electrode layer 203 and the drain electrode layer 205 may be formed to contact opposite ends of the channel layer 202 for example in the x-direction. The source electrode layer 203 and the drain electrode layer 205 may be formed by, for example, applying a chemical vapor deposition method, an atomic layer deposition method, or the like.

Each of the source electrode layer 203 and the drain electrode layer 205 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. Through the above-described methods, a semiconductor device according to another embodiment of the present disclosure may be manufactured.

In some embodiments, before forming the channel layer 202 illustrated in FIG. 11, at least one conductive layer and at least one insulation layer (not illustrated) may be formed. The conductive layer and the insulation layer may form various functional layers in a semiconductor device. For example, the functional layer may include an interconnection layer.

Figure 14:
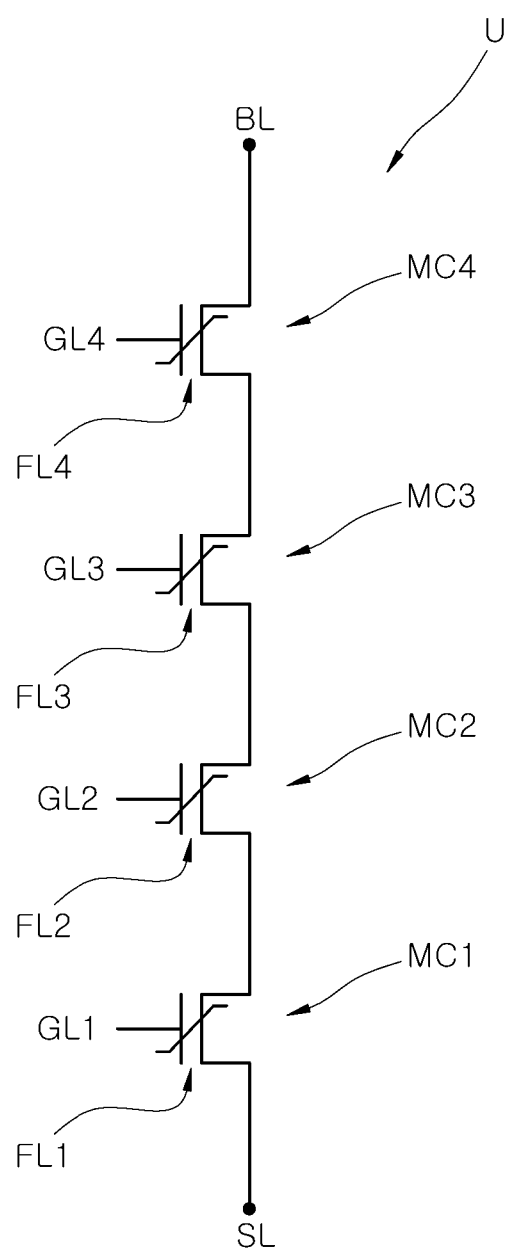
FIG. 14 is a circuit diagram of a semiconductor device according to yet another embodiment of the present disclosure.
Figure 15:
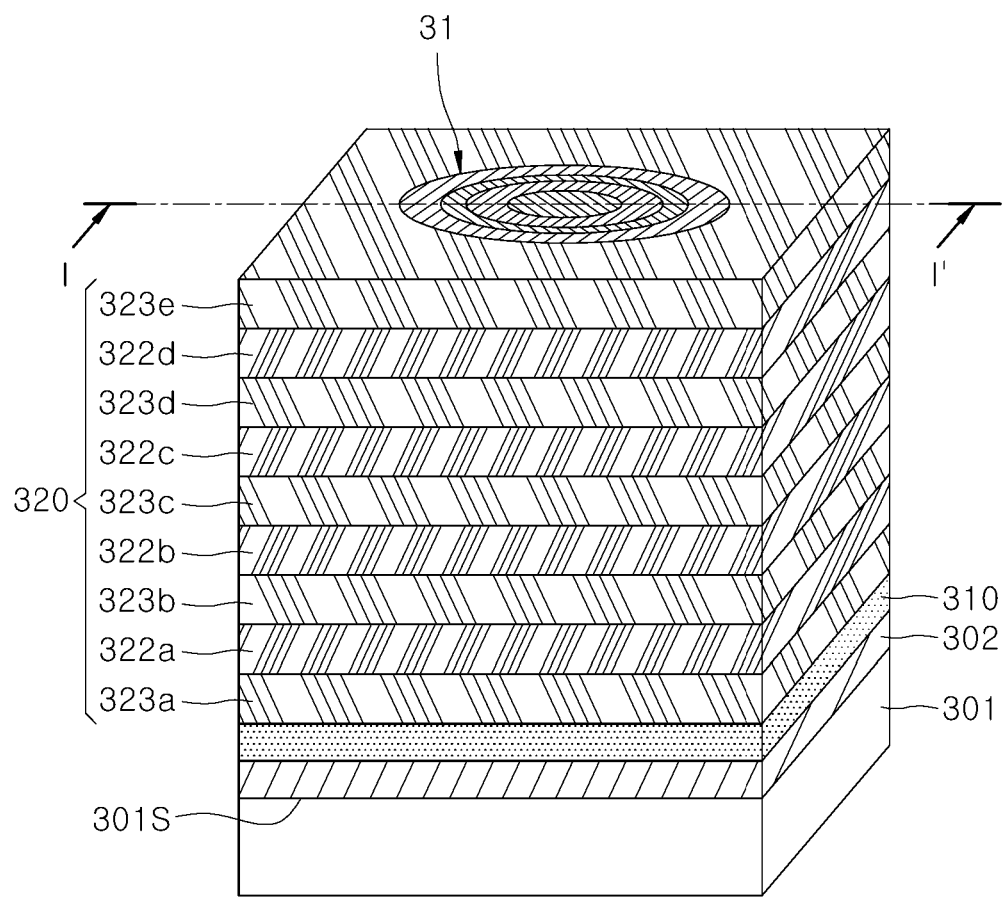
FIG. 15 is a schematic perspective view of a semiconductor device corresponding to the circuit diagram of FIG. 14.
Figure 16:
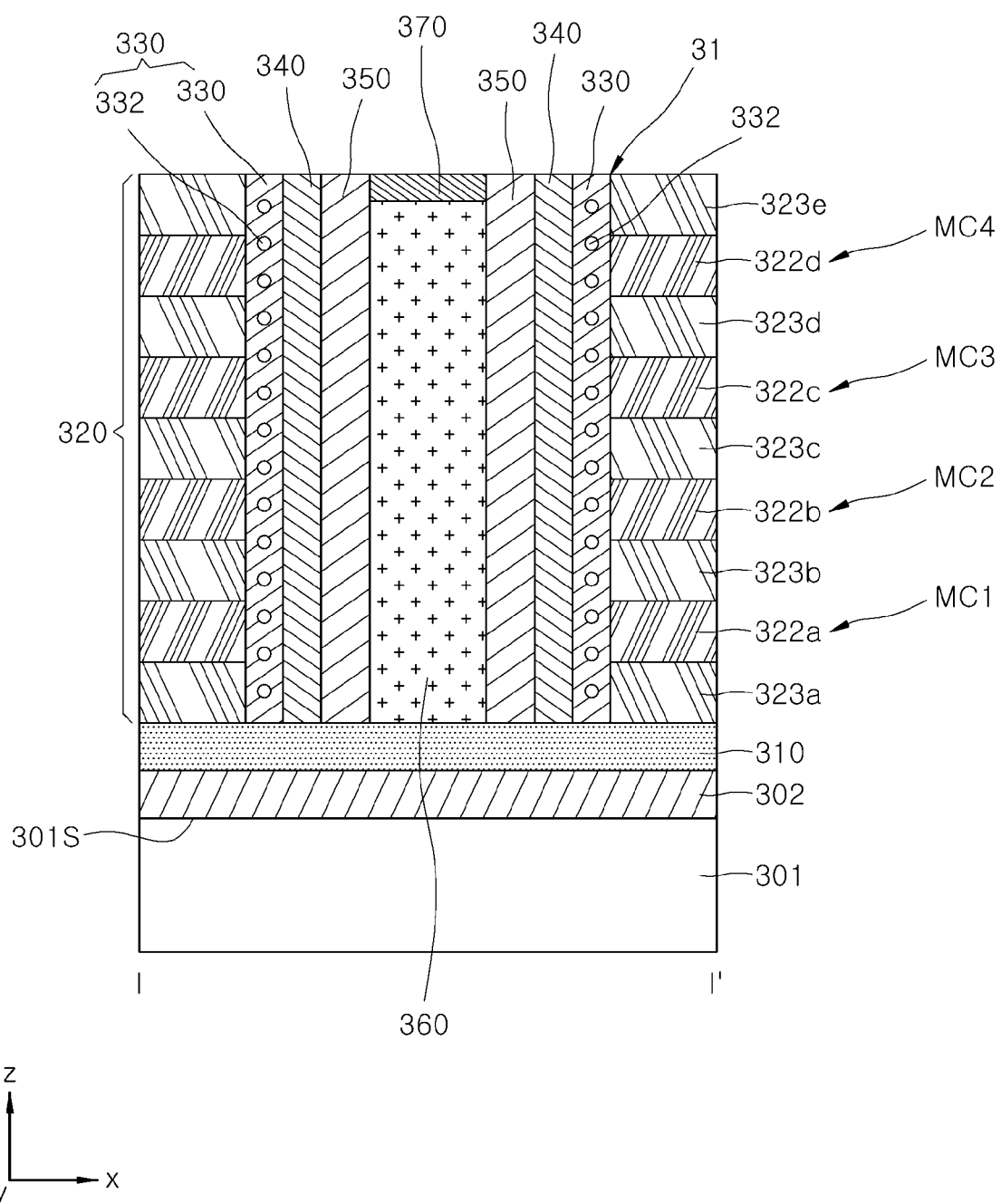
FIG. 16 is a schematic cross-sectional view of a semiconductor device of FIG. 15 taken along a line I-I'.

FIG. 14 is a circuit diagram of a semiconductor device according to yet another embodiment of the present disclosure. FIG. 15 is a schematic perspective view of a semiconductor device corresponding to the circuit diagram of FIG. 14. FIG. 15 may be a structural view of a semiconductor device of FIG. 14. FIG. 16 is a schematic cross-sectional view of a semiconductor device of FIG. 15 taken along the line I-I'.

Referring to FIG. 14, a semiconductor device may include a memory element unit U. The memory element unit U may include transistor-type first to fourth memory cells MC1, MC2, MC3, and MC4. The first to fourth memory cells MC1, MC2, MC3, and MC4 may be connected in series to each other in the form of a string between a source line SL and a bit electrode BL. The memory element unit U may be a NAND type memory device in which the first to fourth memory cells MC1, MC2, MC3, and MC4 are electrically connected in series to each other.

The first to fourth memory cells MC1, MC2, MC3, and MC4 may be nonvolatile memory elements and may include first to fourth ferroelectric elements FL1, FL2, FL3, and FL4, respectively, corresponding to gate dielectric layers of the transistors. The first to fourth memory cells MC1, MC2, MC3, and MC4 may include first to fourth gate electrodes GL1, GL2, GL3, and GL4, respectively, connected to different word lines connected to the memory cells.

Referring to FIGS. 15 and 16, the semiconductor device 3 may include the first to fourth memory cells MC1, MC2, MC3, and MC4, in which each memory cell has a shape of a three-dimensional transistor. The semiconductor device 3 may have a circuit configuration of the memory element unit U of FIG. 14.

The semiconductor device 3 may include a substrate 301 and a gate structure 320 disposed over the substrate 301. The gate structure 320 may include a hole pattern 31. The hole pattern 31 may expose a sidewall surface of the gate structure 320. In addition, the semiconductor device 3 may include a gate insulation layer 330 disposed on the sidewall surface of the gate structure 320, metal particles 332 disposed in an inner region of the gate insulation layer 330, a ferroelectric layer 340 disposed on a sidewall surface of the gate insulation layer 330, and a channel layer 350 disposed on a sidewall surface of the ferroelectric layer 340. In addition, the semiconductor device 3 may include an insulator 360 disposed to contact the channel layer 350 and a channel lower contact layer 310 inside the hole pattern 31.

The semiconductor device 3 may include a base insulation layer 302. The base insulation layer 302 and the channel lower contact layer 310 may be disposed between the substrate 301 and the gate structure 320. The channel lower contact layer 310, which may be disposed on the base insulation layer, may contact an end of the channel layer 350. In addition, the semiconductor device 3 may include a channel upper contact layer 370 disposed on the insulator 360 to be in contact with the other end of the channel layer 350.

Referring to FIGS. 15 and 16, the substrate 301 may include a semiconductor material. The base insulation layer 302 may be disposed on the substrate 301. The base insulation layer 302 may electrically insulate the channel lower contact layer 310 from the substrate 301. The base insulation layer 302 may include an insulating material. Although not illustrated, integrated circuits may be disposed between the substrate 301 and the base insulation layer 302. The integrated circuits may include circuits for driving and controlling the plurality of memory cells of the semiconductor device 3.

The channel lower contact layer 310 may be disposed on the base insulation layer 302. The channel lower contact layer 310 may be electrically connected to the channel layer 350. Although not illustrated, the channel lower contact layer 310 may be electrically connected to a source line. The channel lower contact layer 310 may include a conductive material.

The gate structure 320 may be disposed on the channel lower contact layer 310. The gate structure 320 may include first to fourth gate electrode layers 322a, 322b, 322c, and 322d and first to fifth interlayer insulation layers 323a, 323b, 323c, 323d, and 323e, which are alternately stacked along a first direction (i.e., z-direction) perpendicular to a surface 301S of the substrate 301. The first interlayer insulation layer 323a may be disposed to contact the channel lower contact layer 310. The fifth interlayer insulation layer 323e may be disposed as an uppermost layer of the gate structure 320. Each of the first to fourth gate electrode layers 322a, 322b, 322c, and 322d may include a conductive material. Each of the first to fifth interlayer insulation layers 323a, 323b, 323c, 323d, and 323e may include an insulating material.

The number of gate electrode layers of the gate structure 320 might not necessarily be limited to four as illustrated in FIG. 16. The gate electrode layers may be disposed in various numbers, and the interlayer insulation layer may insulate the various numbers of gate electrode layers from each other in the first direction (i.e., z-direction or vertical direction).

Referring to FIGS. 15 and 16, the hole pattern 31 may be formed to penetrate the gate structure 320 and to expose the channel lower contact layer 310. The hole pattern 31 may be formed, for example, by a photolithography and etching process.

The gate insulation layer 330 may be disposed to cover the sidewall surface of the gate structure 320 inside the hole pattern 31. The gate insulation layer 330 may include an insulating material. The material composition of the gate insulation layer 330 may be substantially the same as the material composition of the gate insulation layer 120 of a semiconductor device 1 described above with reference to FIG. 1.

The metal particles 332 may be disposed in an inner region of the gate insulation layer 330. The metal particles 332 may be configured to trap or de-trap electric charges (e.g., electrons) depending on a polarity of the voltage applied between the gate electrode layers 322a, 322b, 322c, and 322d and the channel layer 350.

The ferroelectric layer 340 may be disposed on the sidewall surface of the gate insulation layer 330. The material composition of the ferroelectric layer 340 may be substantially the same as that of the ferroelectric layer 110 of a semiconductor device 1 described above with reference to FIG. 1.

The channel layer 350 may be disposed to contact the ferroelectric layer 340. The channel layer 350 may extend in a direction substantially perpendicular to the surface 301S of the substrate 301 inside the hole pattern 31, for example, in the z-direction. The channel layer 350 may include a semiconductor material. The channel layer 350 may have electrical conductivity by being doped with a dopant. The material composition of the channel layer 350 may be substantially the same as the material composition of a channel layer 202 of a semiconductor device 2 described with reference to FIG. 4.

Referring to FIGS. 15 and 16, the channel upper contact layer 370 may be disposed on the insulator 360. The channel upper contact layer 370 may be electrically connected to a bit line (not shown). The channel upper contact layer 370 may include a conductive material. The channel upper contact layer 370 may be made of the same material as the channel lower contact layer 310.

As described above, the semiconductor device 3 may have a device structure corresponding to the circuit configuration of the memory element unit U of FIG. 14. As an example, the first memory cell MC1 may include a first gate electrode layer 322a, a portion of the gate insulation layer 330 electrically controlled by the first gate electrode layer 322a, a portion of the ferroelectric layer 340 electrically controlled by the first gate electrode layer 322a, and a portion of the channel layer 350 electrically controlled by the first gate electrode layer 322a. As another example, the second memory cell MC2 may include a second gate electrode layer 322b, a portion of the gate insulation layer 330 electrically controlled by the second electrode layer 322b, a portion of the ferroelectric layer 340 electrically controlled by the second electrode layer 322b, and a portion of the channel layer 350 electrically controlled by the second gate electrode layer 322b. As another example, the third memory cell MC3 may include a third gate electrode layer 322c, a portion of the gate insulation layer 330 electrically controlled by the third gate electrode layer 322c, a portion of the ferroelectric layer 340 electrically controlled by the third electrode layer 322c, and a portion of the channel layer 350 electrically controlled by the third gate electrode layer 322c. As further example, the fourth memory cell MC4 may include a fourth gate electrode layer 322d, a portion of the gate insulation layer 330 electrically controlled by the fourth gate electrode layer 322d, a portion of the ferroelectric layer 340 electrically controlled by the fourth electrode layer 322d, and a portion of the channel layer 350 electrically controlled by the fourth gate electrode layer 322d.

As described above, according to embodiments of the present disclosure, a semiconductor device including a ferroelectric layer and a gate insulation layer that are disposed between the gate electrode layer and channel layer may be provided. The semiconductor device may include metal particles disposed in an inner region of the gate insulation layer.

The metal particles may increase the operation voltage range of the semiconductor device, that is, the memory operation window, which results from trapping and de-trapping charges in the gate insulation layer during operations of the semiconductor device. In addition, as described above, the metal particles may induce strains in the gate insulation layer, and the strains may increase the permittivity and capacitance of the gate insulation layer. As a result, the operational performance of semiconductor devices according to embodiments may be improved, and the reliability of remanent polarization written into the ferroelectric layer may be improved. The durability of the ferroelectric layer may also be improved.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
a substrate;
a ferroelectric layer disposed on the substrate;
a gate insulation layer disposed on the ferroelectric layer;
metal particles disposed in the gate insulation layer; and
a gate electrode layer disposed on the gate insulation layer,
wherein the metal particles are embedded in an inner region of the gate insulation layer, and
wherein the metal particles are distributed on a plane, spaced apart from the ferroelectric layer.

2. The semiconductor device of claim 1, further comprising a source region and a drain region spaced apart in the substrate.

3. The semiconductor device of claim 1, wherein the ferroelectric layer includes at least one oxide selected from the group consisting of hafnium oxide, zirconium oxide, and hafnium zirconium oxide.

4. The semiconductor device of claim 3, wherein the ferroelectric layer includes at least one dopant, and
wherein the dopant includes at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La).

5. The semiconductor device of claim 1, wherein the ferroelectric layer includes a metal oxide having a perovskite structure.

6. The semiconductor device of claim 1, wherein the metal particles are distributed on the plane spaced apart from an interface between the ferroelectric layer and the gate insulation layer.

7. The semiconductor device of claim 6, wherein the plane is parallel to the interface between the ferroelectric layer and the gate insulation layer.

8. The semiconductor device of claim 1, wherein the metal particles have a diameter of 0.1 nanometer (nm) to 5 nanometers (nm).

9. The semiconductor device of claim 1, wherein the metal particles include at least one selected from the group consisting of cobalt (Co), nickel (Ni), copper (Cu), iron (Fe), platinum (Pt), gold (Au), silver (Ag), iridium (Ir), ruthenium (Ru), palladium (Pd), and manganese (Mn).

10. The semiconductor device of claim 1, wherein the metal particles trap or de-trap electric charges according to a polarity of a voltage applied between the gate electrode layer and the substrate.

11. A semiconductor device comprising:
a substrate;
a channel layer disposed on the substrate;
a ferroelectric layer disposed on the channel layer;
a gate insulation layer disposed on the ferroelectric layer;
metal particles disposed in the gate insulation layer;
a gate electrode layer disposed on the gate insulation layer; and
a source electrode layer and a drain electrode layer that are disposed over the substrate and that respectively contact opposite ends of the channel layer,
wherein the metal particles are embedded in an inner region of the gate insulation layer, and
wherein the metal particles are distributed on a plane, spaced apart from the ferroelectric layer.

12. The semiconductor device of claim 11, wherein the metal particles are distributed on the plane spaced apart from an interface between the ferroelectric layer and the gate insulation layer.

13. The semiconductor device of claim 11, wherein the metal particles are distributed on the plane that is parallel to an interface between the ferroelectric layer and the gate insulation layer.

14. The semiconductor device of claim 11, wherein the metal particles trap or de-trap electric charges according to a polarity of a voltage applied between the gate electrode layer and the substrate.

15. A semiconductor device comprising:
a substrate;
a gate structure including a hole pattern disposed over the substrate, the gate structure including gate electrode layers and interlayer insulation layers that are alternately stacked;
a gate insulation layer disposed on a sidewall surface of the gate structure exposed by the hole pattern;
metal particles distributed in the gate insulation layer;
a ferroelectric layer disposed on the gate insulation layer; and
a channel layer disposed on the ferroelectric layer,
wherein the metal particles are embedded in an inner region of the gate insulation layer, and
wherein the metal particles are distributed on a plane, spaced apart from the ferroelectric layer.

16. The semiconductor device of claim 15, wherein the channel layer extends in a direction substantially perpendicular to an upper surface of the substrate.

17. The semiconductor device of claim 15, further comprising a source line and a bit line electrically connected to opposite ends of the channel layer.

18. The semiconductor device of claim 15, wherein the metal particles are distributed on the plane spaced apart from an interface of the ferroelectric layer and the gate insulation layer.

19. The semiconductor device of claim 18, wherein the plane is parallel to the interface of the ferroelectric layer and the gate insulation layer.

20. The semiconductor device of claim 15, wherein the metal particles have a diameter of 0.1 nanometer (nm) to 5 nanometers (nm).

21. The semiconductor device of claim 15, wherein the metal particles include at least one selected from the group consisting of cobalt (Co), nickel (Ni), copper (Cu), iron (Fe), platinum (Pt), gold (Au), silver (Ag), iridium (Ir), ruthenium (Ru), palladium (Pd), and manganese (Mn).

22. The semiconductor device of claim 15, wherein the metal particles trap or de-trap electric charges according to a polarity of a voltage applied between the gate electrode layers and the channel layer.

* * * * *